United States Patent
Sato et al.

(10) Patent No.: US 7,738,262 B2
(45) Date of Patent: Jun. 15, 2010

(54) PLUG-IN UNIT AND COMMUNICATION APPARATUS

(75) Inventors: Yoshiyuki Sato, Kawasaki (JP); Mitsuo Fujimura, Kawasaki (JP); Takashi Shirakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 292 days.

(21) Appl. No.: 11/842,378

(22) Filed: Aug. 21, 2007

(65) Prior Publication Data

US 2007/0293065 A1    Dec. 20, 2007

Related U.S. Application Data

(63) Continuation of application No. PCT/JP2005/003183, filed on Feb. 25, 2005.

(51) Int. Cl.
*H05K 9/00* (2006.01)
(52) U.S. Cl. .................. 361/816; 361/800; 361/818
(58) Field of Classification Search .............. 361/800, 361/816, 753, 799; 174/371, 152 E, 520, 174/350; 439/13, 607, 607.2
See application file for complete search history.

(56) References Cited

U.S. PATENT DOCUMENTS

| | | | |
|---|---|---|---|
| 5,319,524 A * | 6/1994 | Welch et al. ............. | 361/754 |
| 5,583,750 A | 12/1996 | Nakata et al. | |
| 6,552,915 B2 | 4/2003 | Takahashi et al. | |
| 6,709,168 B2 | 3/2004 | Imabayashi et al. | |
| 6,768,651 B2 | 7/2004 | Takahashi et al. | |
| 2002/0006026 A1 | 1/2002 | Takahashi et al. | |
| 2002/0012238 A1 | 1/2002 | Takahashi et al. | |
| 2003/0048999 A1 | 3/2003 | Imabayashi et al. | |

FOREIGN PATENT DOCUMENTS

| | | |
|---|---|---|
| JP | SHO 61-12291 | 1/1986 |
| JP | 8125373 | 5/1996 |
| JP | 2002-050887 | 2/2002 |
| JP | 2002-313495 | 10/2002 |
| JP | 2003-086967 | 3/2003 |
| JP | 2004-235301 | 8/2004 |
| WO | WO-00-74454 | 12/2000 |

OTHER PUBLICATIONS

International Search Report, dated May 31, 2005 of corresponding application No. PCT/JP2005/003183.

* cited by examiner

*Primary Examiner*—Jeremy C Norris
*Assistant Examiner*—Abiy Getachew
(74) *Attorney, Agent, or Firm*—Katten Muchin Roiseman LLP

(57) ABSTRACT

In order to detachably mount a module to a plug-in unit while reliably realizing electromagnetic shielding of the plug-in unit in a communication apparatus having a sub-rack and the plug-in unit electrically connected to the sub-rack, the present invention provides a second shield cover member covering a portion protruding from a front end surface of a printed board in an interface part and having a first opening to expose a connection with an outside provided at a front end of the interface part to the outside, the first opening being in contact with a circumferential surface of the interface part and a shield mechanism interposed between the second shield cover member and a front cover member to cover a gap between a second opening of the front cover member and an outer circumferential surface of the second shield cover member.

10 Claims, 12 Drawing Sheets

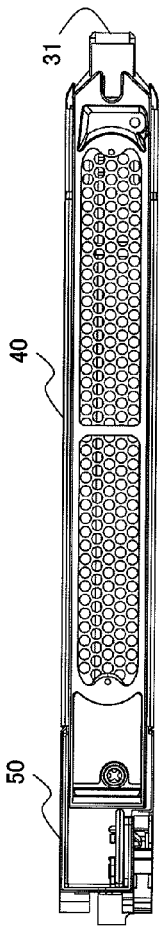
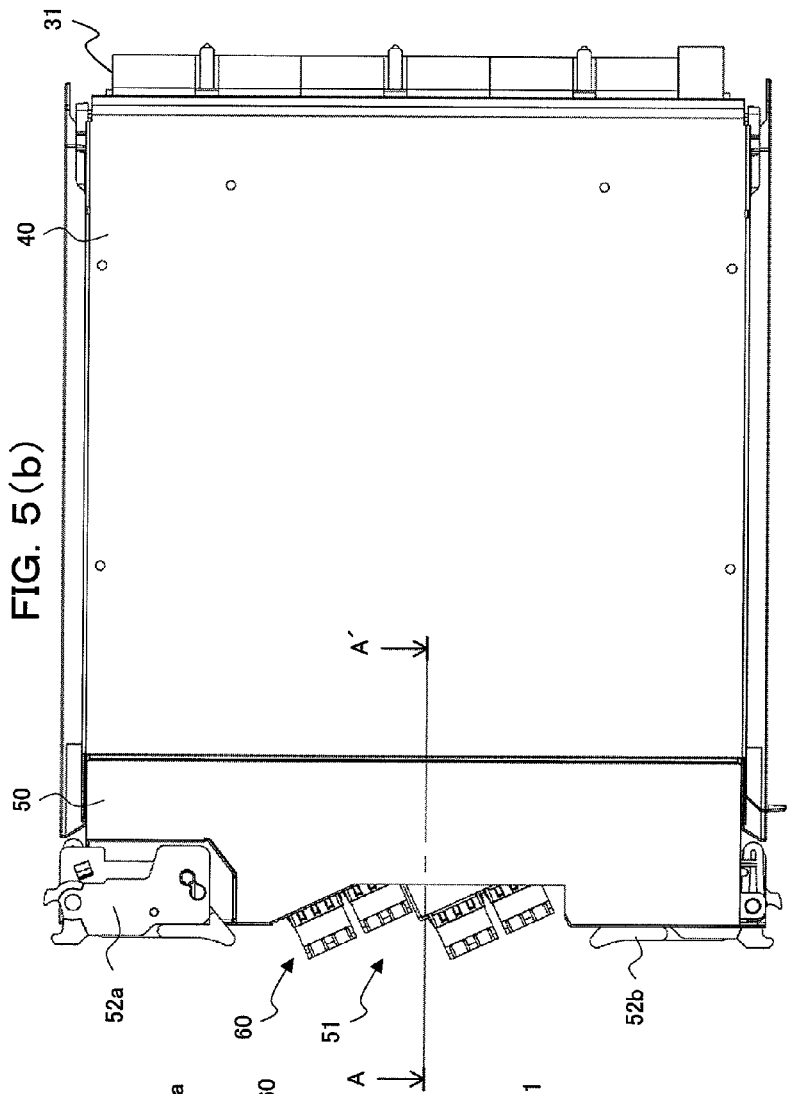
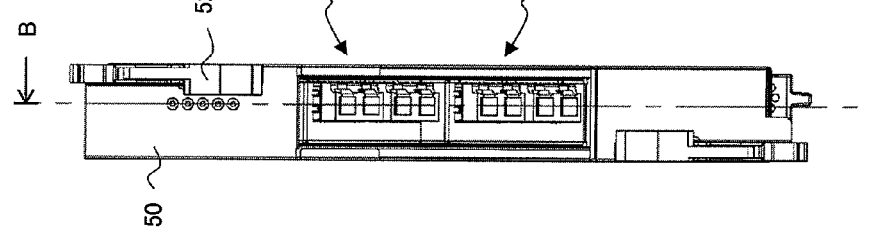

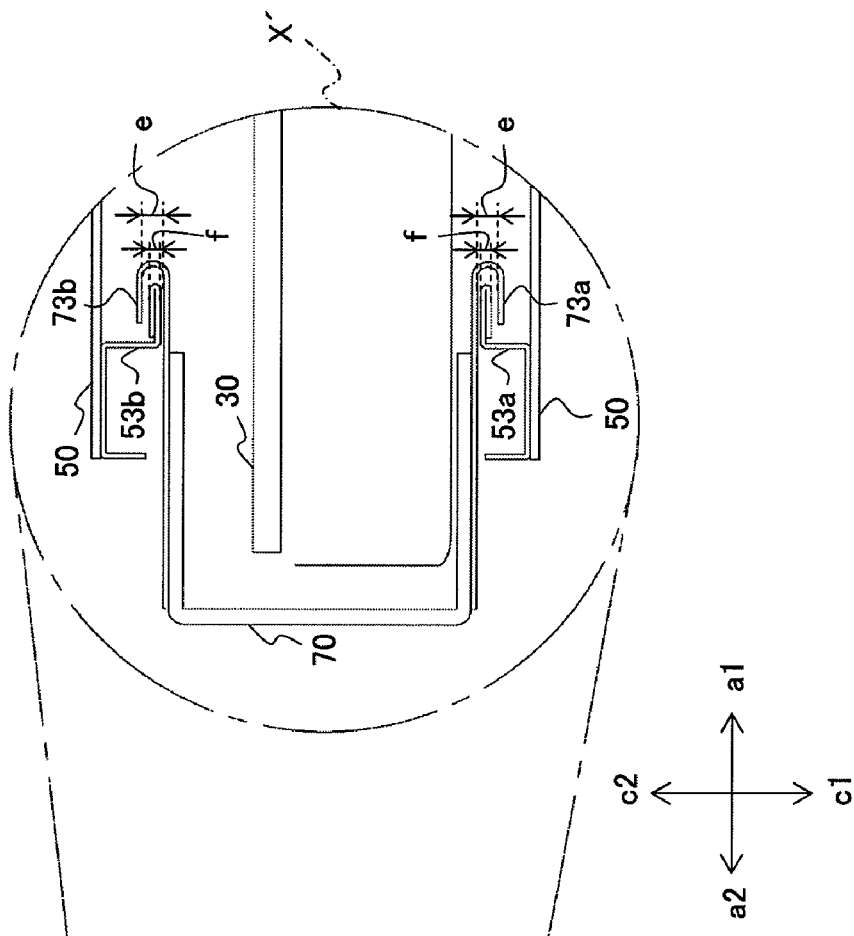
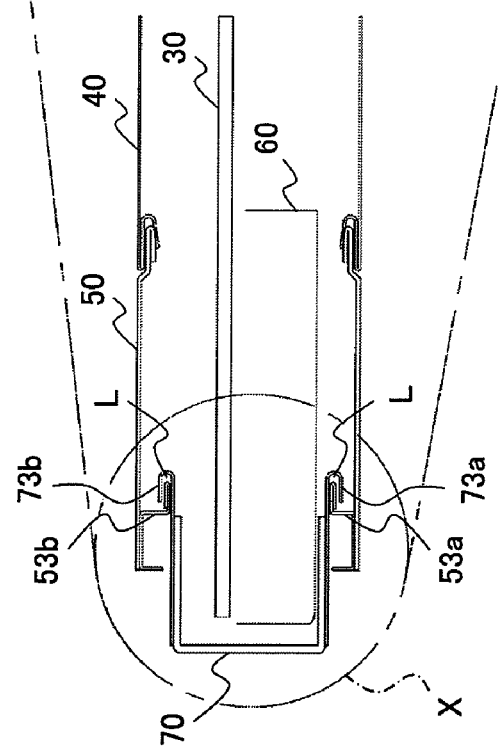
FIG. 6(a)
FIG. 6(b)

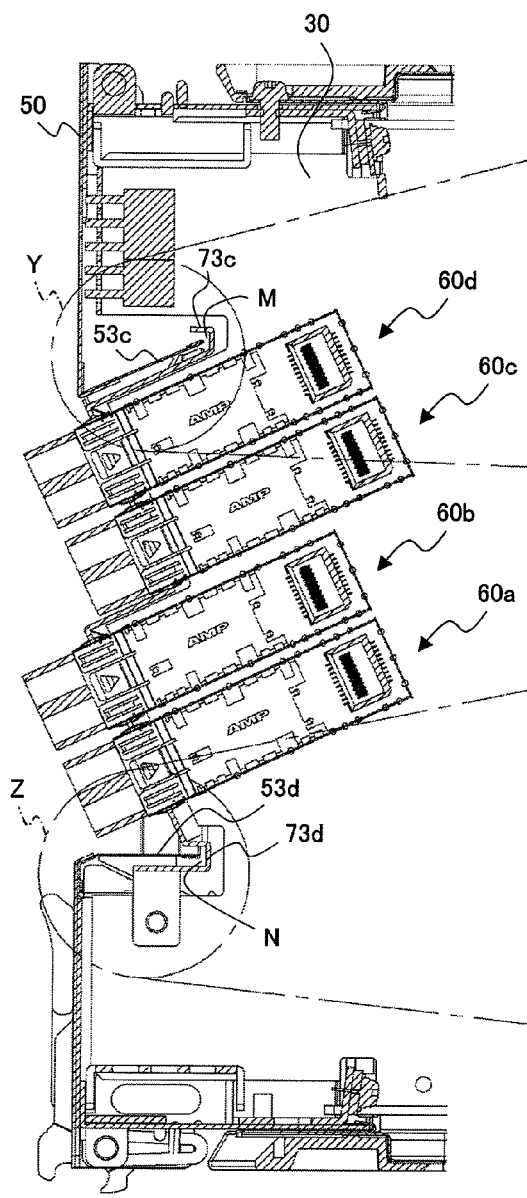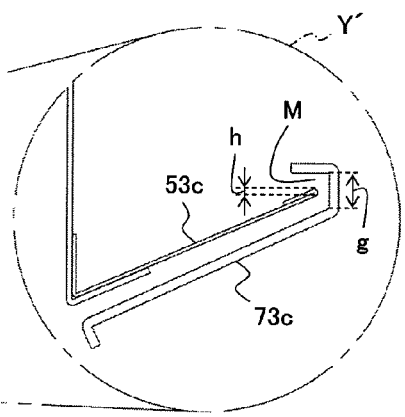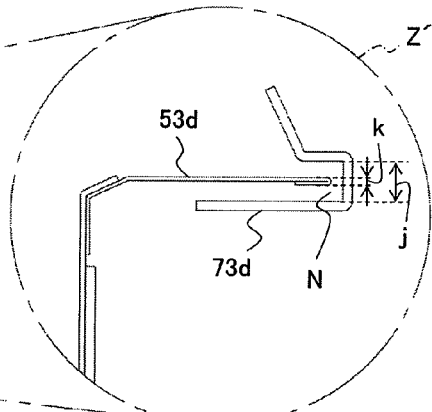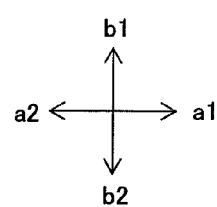

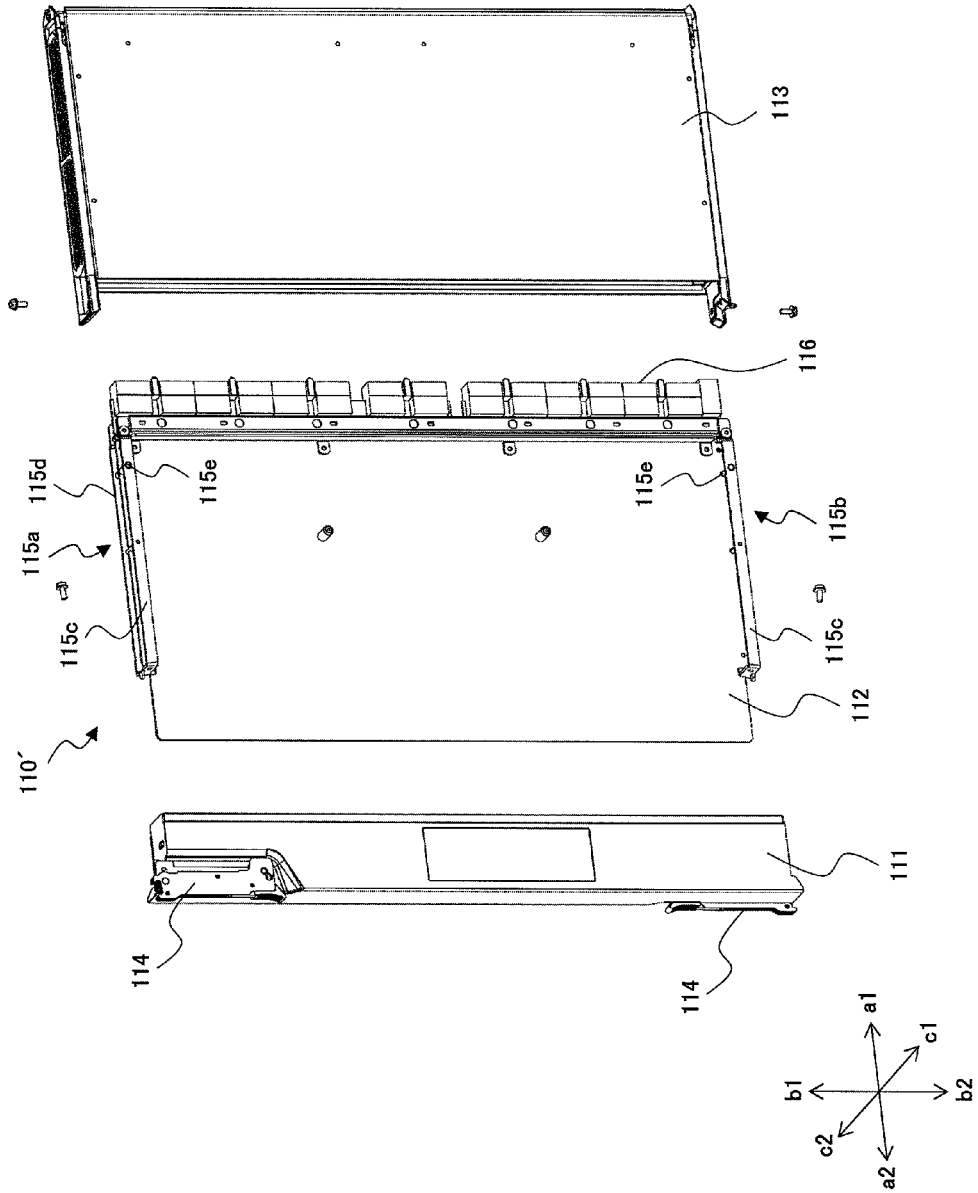

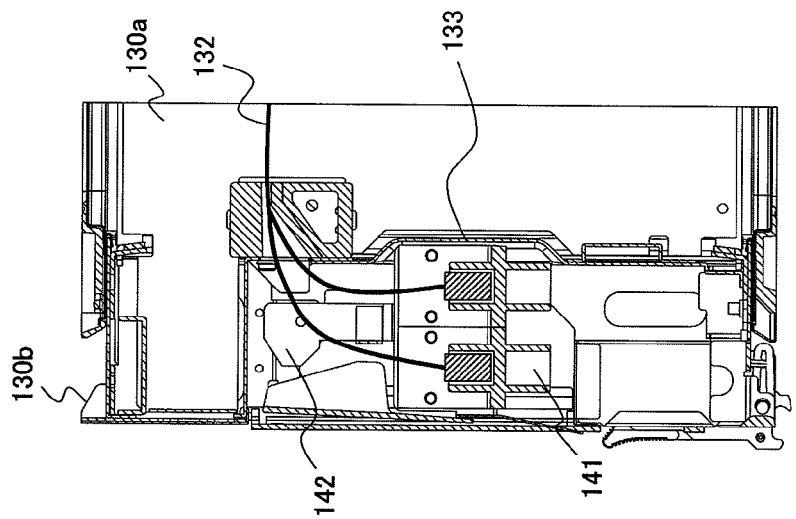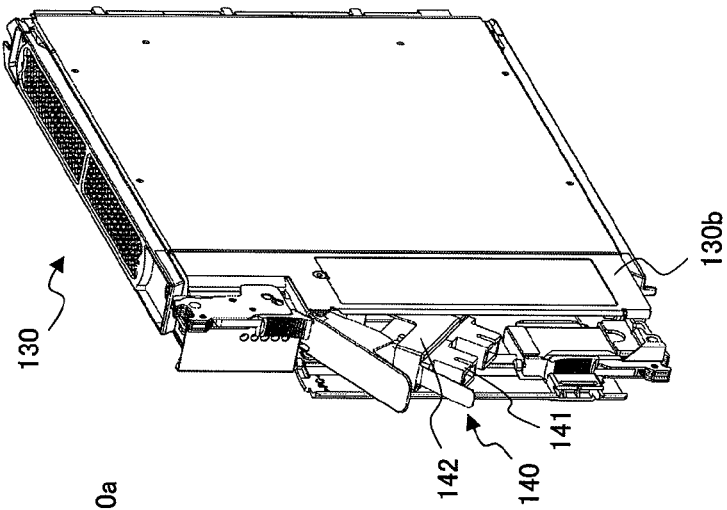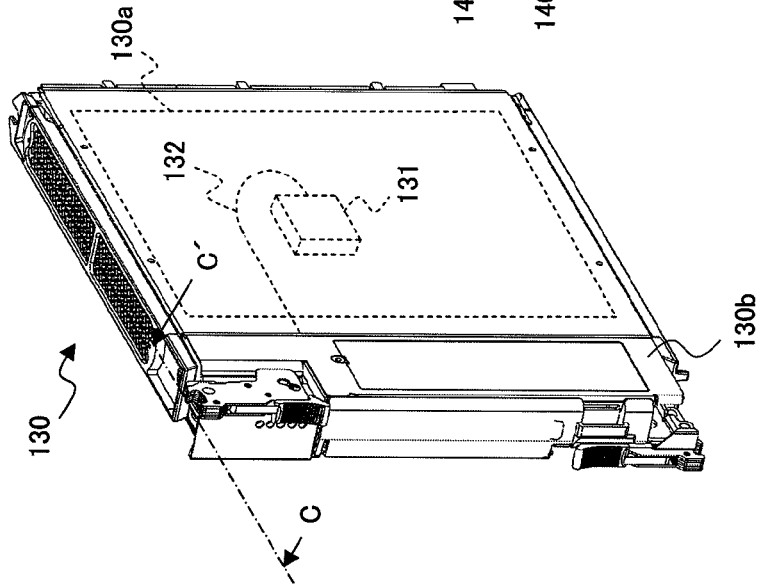

PLUG-IN UNIT AND COMMUNICATION APPARATUS

BACKGROUND OF THE INVENTION

1) Field of the Invention

The present invention relates to a plug-in unit mechanically and electrically connected to a sub-rack having a back plane with a connector and a communication apparatus having such a plug-in unit, and in particular, relates to a technique for realizing electromagnetic shielding and reduction of an influence caused by static electricity in a plug-in unit.

2) Description of the Related Art

With rapid progress of technological innovation, present-day electronic devices are ever on their way to higher performance such as improvement in processing speed and higher-density packaging of electronic components, and accompanying such trends are a rapid increase in radiant quantity of electromagnetic waves from internal circuits of electronic devices and much shorter wavelengths of electromagnetic waves due to higher processing speeds.

Electromagnetic waves can have harmful effects such as malfunctioning and noise contamination of nearby devices, and inoperability and noise contamination of radio broadcasting of TV and radio and radio communications. Also with higher performance, electronic devices have become more sensitive, and malfunctioning by receiving electromagnetic waves radiated by nearby devices and destruction and malfunctioning of electronic components caused by static electricity are more likely to occur. Grave damage such as malfunctioning and destruction caused by these electromagnetic waves and static electricity is a very important challenge to stable operation of electronic devices and demand for electromagnetic shielding and making electronic devices unsusceptible to influences of static electricity is increasing with higher performance of electronic devices.

Thus, for a communication apparatus in which a plurality of plug-in units are installed in a sub-rack device by insertion, a technique (for example, see Patent Document 1) in which, in a plug-in unit, electromagnetic shielding is realized by covering a printed wiring board (hereinafter referred to as a printed board) on which electronic components are mounted with a metallic case has been proposed.

By making electromagnetic waves more unlikely to have an influence to the outside of a plug-in unit with implementation of electromagnetic shielding in the plug-in unit, an influence of electromagnetic waves on electronic devices near the plug-in unit can be eliminated.

Further, a technique (for example, see Patent Document 2) to realize reduction of an influence caused by static electricity by grounding the plug-in units via the sub-rack device has also been proposed.

Here, a communication apparatus 100 having a conventional electromagnetic shielding mechanism will be described with reference to FIG. 8 and FIG. 9. The communication apparatus 100 comprises a sub-rack device 120 adopting a bookshelf form and a plurality of plug-in units 110 mounted in the sub-rack device 120. Numeral 110' in FIG. 8 and FIG. 9 denotes the plug-in unit 110 before assembled.

The plug-in unit 110 comprises a front panel 111, a printed board 112, and a shield cover 113 so that the front panel 111 covers the front of the printed board 112 and the shield cover 113 covers upper and lower surfaces and both sides of the printed board 112.

Meanwhile, card levers 114 for linking to the shield cover 113 are rotatably placed opposite to each other in upper and lower parts of the front panel 111.

Here, a more detailed description of the plug-in unit 110 will be provided. The printed board 112 of the plug-in unit 110 is inserted into the cylindrical or box-shaped shield cover 113 via arm members 115a and 115b placed to extend along the upper and lower surfaces of the printed board 112, and further the front panel 111 and each of the arm members 115a and 115b of the plug-in unit 110 are linked.

Each of the arm members 115a and 115b comprises plates 115c and 115d sandwiching the printed board 112 with a predetermined space from both sides and a pin 115e that is interposed between the plates 115c and 115d and whose ends are joined to the plates 115c and 115d.

Then, as shown in FIG. 10(a), a cutout 112a extending toward a top end surface of the printed board 112 is provided at a position corresponding to the pin 115e of the arm member 115a of the printed board 112, and the cutout 112a extending toward a lower end of the printed board 112 is also provided at a position corresponding to the pin 115e of the arm member 115b of the printed board 112.

The pin 115e is inserted into each of these cutouts 112a, and a width W of the cutout 112a is designed to be slightly larger than a diameter D of the pin 115e so that the printed board 112 has little play in an insertion/removal direction (a1-a2 direction) of the sub-rack device of the plug-in unit 110.

A length F of the cutout 112a, on the other hand, is designed to be larger than the diameter D of the pin 115e so that the printed board 112 is freely movable in a vertical direction (b1-b2 direction)

By configuring the plug-in unit 110 such that the printed board 112 is freely movable in the vertical direction, a back plane connector 122 (See FIG. 8) provided in a back plane 121 (See FIG. 8) of the sub-rack device 120 and a plug-in unit connector 116 provided at a rear end of the printed board 112 can be connected without being influenced by variations (tolerance accumulation) of dimensions of components of the plug-in unit 110 and sub-rack device 120.

Here, an insertion sequence of the plug-in unit 110 into the sub-rack device 120 will be described with reference to FIGS. 10(a) to (c). First, as shown in FIG. 10(a), the plug-in unit 110 is moved in an insertion direction (a1 direction) along a lower rail 123 (See FIG. 8) of the sub-rack device 120 in a process of inserting the plug-in unit 110 into the sub-rack device 120.

Then, as shown in FIG. 10(b), the plug-in unit 110 is further inserted into the sub-rack device 120 so that a guide projection 116a of the plug-in unit connector 116 and a guide hole 122a of the back plane connector 122 are brought into contact. If the plug-in unit 110 is further inserted, since the printed board 112 is configured to be freely movable in the vertical direction, the printed board 112 is moved to an appropriate position in the vertical direction (b1-b2 direction) to be plugged in by being guided by end faces of the guide projection 116a and guide hole 112a so that, as shown in FIG. 10(c), the plug-in unit connector 116 can reliably be connected to the back plane connector 122.

Meanwhile, a module called a pig tail in which an optical fiber cable is connected to an optical module in an undetachable state has conventionally been used widely as an optical module mounted in a communication apparatus to switch electric and optical signals (See, for example, Patent Document 3).

FIGS. 11(a) to (c) show a plug-in unit 130 in which an optical module 131 of a conventional pig tail type is mounted. FIG. 11(c) is a C-C' sectional view of a front portion of the plug-in unit 130 shown in FIG. 11(a). When the optical module 131 to which an optical fiber cable 132 is connected in an undetachable state is used, as shown in FIG. 11(a), the optical module 131 is electrically connected to a printed board 130a by being fastened to the printed board 130a by soldering.

As shown in FIGS. 11(b) and (c), the plug-in unit 130 has an interface 140 for optical fiber connection on a front side. The interface 140 is configured by arranging an optical adapter 141 for connecting and relaying an optical connector to both sides on a swing 142 that is rotatable with respect to a front panel 130b and also connecting another end of the optical fiber cable 132 connected to the optical module 131 for converting electric and optical signals in an undetachable state to the optical adapter 141.

As shown in FIG. 11(c), the conventional plug-in unit 130 in which the optical module 131 of the pig tail type is mounted has a boundary part 133 between the printed board 130a and swing 142 and electromagnetic shielding is thereby realized.

Meanwhile, with ever higher functionality of electronic components, plug-in units in which an optical module [for example, SFP (Small form Factor Pluggable)] obtained by insertably/removably connecting an optical fiber cable and optical module to an optical connector is mounted are nowadays increasingly used.

FIGS. 12(a) and (b) show a plug-in unit 150 in which an SFP 152 is mounted. As shown in FIGS. 12(a) and (b), the plug-in unit 150 has only cases (cages) 153 and electric connectors (not shown) fastened to a printed board 151 for housing the SFPs 152 and the SFP 152 is insertable/removable into/from the case 153. The printed board 151 has four SFPs 152 and cases 153 mounted on the printed board 151.

Then, a front panel 154 of the plug-in unit 150 has an opening (hole) 155 for exposing the SFP 152 to the outside provided at a position corresponding to the SFP 152 and the SFP 152 is thereby mounted in a state in which the SFP 152 is detachable from the front of the plug-in unit 150.

For reasons described above with reference to FIGS. 10(a) to (c), a height (opening length in the vertical direction) of the opening 155 of the front panel 154 is made sufficiently higher (longer) than that (length in the vertical direction) of the SFP 152 also in the plug-in unit 150 to make the printed board 151 freely movable in the vertical direction (b1-b2 direction).

In the plug-in unit 150, as described above, even when a necessity for classification change such as a wavelength of optical signals arises, an end user can cope with the necessity by a simple means of replacing the SFP 152 with another optical module by configuring the SFP 152 to be detachable from the printed board 151 and thus diversified requests to the communication apparatus can be met.

However, as described above with reference to FIG. 11, while the plug-in unit 130 in which the optical module 131 of the pig tail type is mounted can realize electromagnetic shielding and the like, the plug-in unit 150 in which the SFP 152 is detachably mounted has the opening 155 in the front panel 151 and thus has an insufficient boundary of electromagnetic shielding from outside, is likely to direct an influence of electromagnetic waves to the outside and is also susceptible to static electricity.

The present invention has been made in view of the above problems and an object thereof is to make it possible, in a communication apparatus having a sub-rack and a plug-in unit electrically connected to the sub-rack, to detachably mount a module (for example, an optical module) to the plug-in unit while reliably realizing electromagnetic shielding of the plug-in unit. Another object of the present invention is to enable realization of reduction of an influence caused by static electricity.

Patent Document 1: WO 00/074454

Patent Document 2: Japanese Patent Application Laid-Open No. 2002-050887

Patent Document 3: Japanese Patent Application Laid-Open No. 2003-086967

SUMMARY OF THE INVENTION

To achieve the above objects, a plug-in unit in one aspect of the present invention comprises: a printed board on which an interface part is mounted as an interface with an outside; a first shield cover member covering each of upper and lower surfaces and both sides of the printed board; a second shield cover member covering a portion protruding from a front end surface of the printed board in the interface part and having a first opening to expose a connection with the outside provided at a front end of the interface part to the outside, the first opening being in contact with a circumferential surface of the interface part; a front cover member covering a front of the printed board and having a second opening to expose the connection of the interface part to the outside; and a shield mechanism interposed between the second shield cover member and the front cover member to cover a gap between the second opening of the front cover member and an outer circumferential surface of the second shield cover member.

Also, to achieve the above objects, a communication apparatus in one aspect of the present invention comprises: a sub-rack having a back plane with a connector; and a plug-in unit mounted to the sub-rack by electric connection via the connector of the back plane, wherein the plug-in unit comprises: a printed board on which an interface part is mounted as an interface with an outside; a first shield cover member covering each of upper and lower surfaces and both sides of the printed board; a second shield cover member covering a portion protruding from a front end surface of the printed board in the interface part and having a first opening to expose a connection with the outside provided at a front end of the interface part to the outside, the first opening being in contact with a circumferential surface; a front cover member covering a front of the printed board and having a second opening to expose the connection of the interface part to the outside; and a shield mechanism interposed between the second shield cover member and the front cover member to cover a gap between the second opening of the front cover member and an outer circumferential surface of the second shield cover member.

In the plug-in unit and communication apparatus described above, the shield mechanism preferably comprises a standing wall part forming grooves on the circumferential surface of the second shield cover member, facing the front cover member and pieces extending along the edge of the second opening on an inside surface of the front cover member, and extending in the groove formed by the standing wall part and, in this case, it is preferable that the printed board is housed in the first shield cover member and the front cover member freely movably in upper-lower direction of the printed board, the second shield cover member is fastened to the printed board and inside dimensions of the grooves formed on upper and lower surfaces of the second shield cover member from among the grooves formed by the standing wall part are formed larger than outside dimensions of the pieces of the front cover member extending in the groove.

Further, in the plug-in unit and communication apparatus in the present invention described above, it is preferable that the second shield cover member is grounded and, in this case, the second shield cover member is grounded via the front cover member and the first shield cover member.

According to the plug-in unit and communication apparatus, as described above, with the shield mechanism, a portion protruding from the front end surface of the printed board in the interface part is covered by the second shield cover member and a gap between the second opening of the front cover member and the outer circumferential surface of the second shield cover member is covered by the shield mechanism, and therefore even when an optical module is detachably configured in the interface part, it becomes possible not only to realize electromagnetic shielding of the plug-in unit reliably, but also to realize reduction of an influence of static electricity.

BRIEF DESCRIPTION OF THE DRAWINGS

FIGS. 5(a) to (c) are diagrams showing the plug-in unit of the communication apparatus as an embodiment of the present invention; (a) is a top view thereof, (b) is a side view thereof, and (c) is a front view thereof;

FIG. 6(a) is a sectional view showing an A-A' cross section of FIG. 5(b), and (b) is a sectional view showing an X portion of (a) by enlarging the X portion;

FIG. 7(a) is a sectional view showing a B-B' cross section of FIG. 5(c), (b) is a sectional view showing a Y portion of (a) by enlarging the Y portion, and (c) is a sectional view showing a Z portion of (a) by enlarging the Z portion;

FIG. 9 is an exploded perspective view illustrating the structure of a plug-in unit of the conventional communication apparatus shown in FIG. 8;

FIGS. 11(a) to (c) are diagrams showing a conventional plug-in unit having a pig tail; (a) is a perspective view thereof, (b) is a perspective view when an interface part to the outside is exposed, and (c) is a C-C' sectional view of (a)

DETAILED DESCRIPTION OF THE PREFERRED EMBODIMENT

An embodiment of the present invention will be described below with reference to drawings.

[1] An Embodiment of the Present Invention

Figure 1:
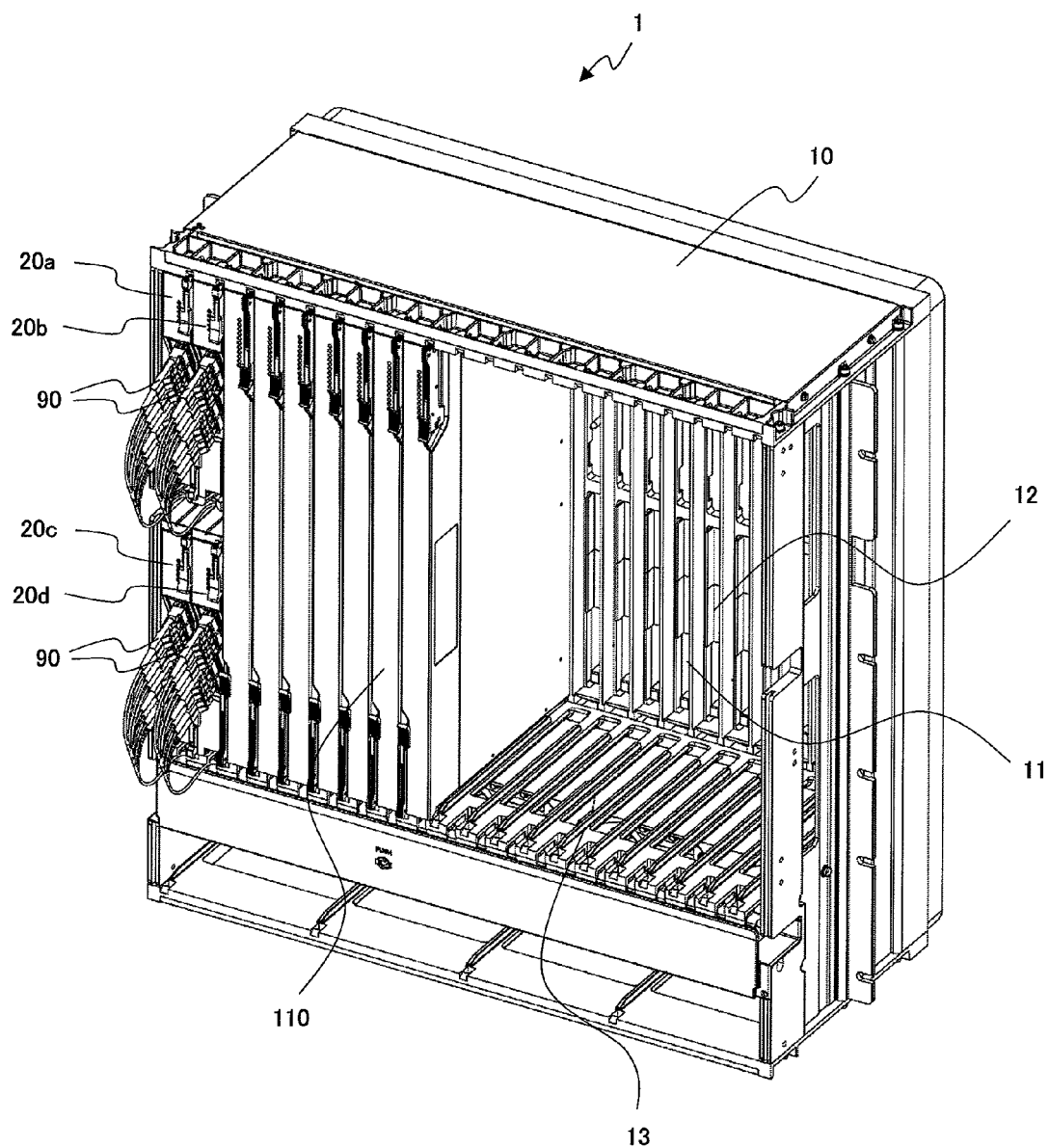
FIG. 1 is a perspective view showing a communication apparatus as an embodiment of the present invention.

First, a communication apparatus as an embodiment of the present invention will be described. FIG. 1 is a block diagram showing a configuration of the communication apparatus as an embodiment of the present invention. The same numerals in FIG. 1 as those already described denote the same parts or almost identical parts and thus a detailed description thereof will not be provided.

Figure 8:
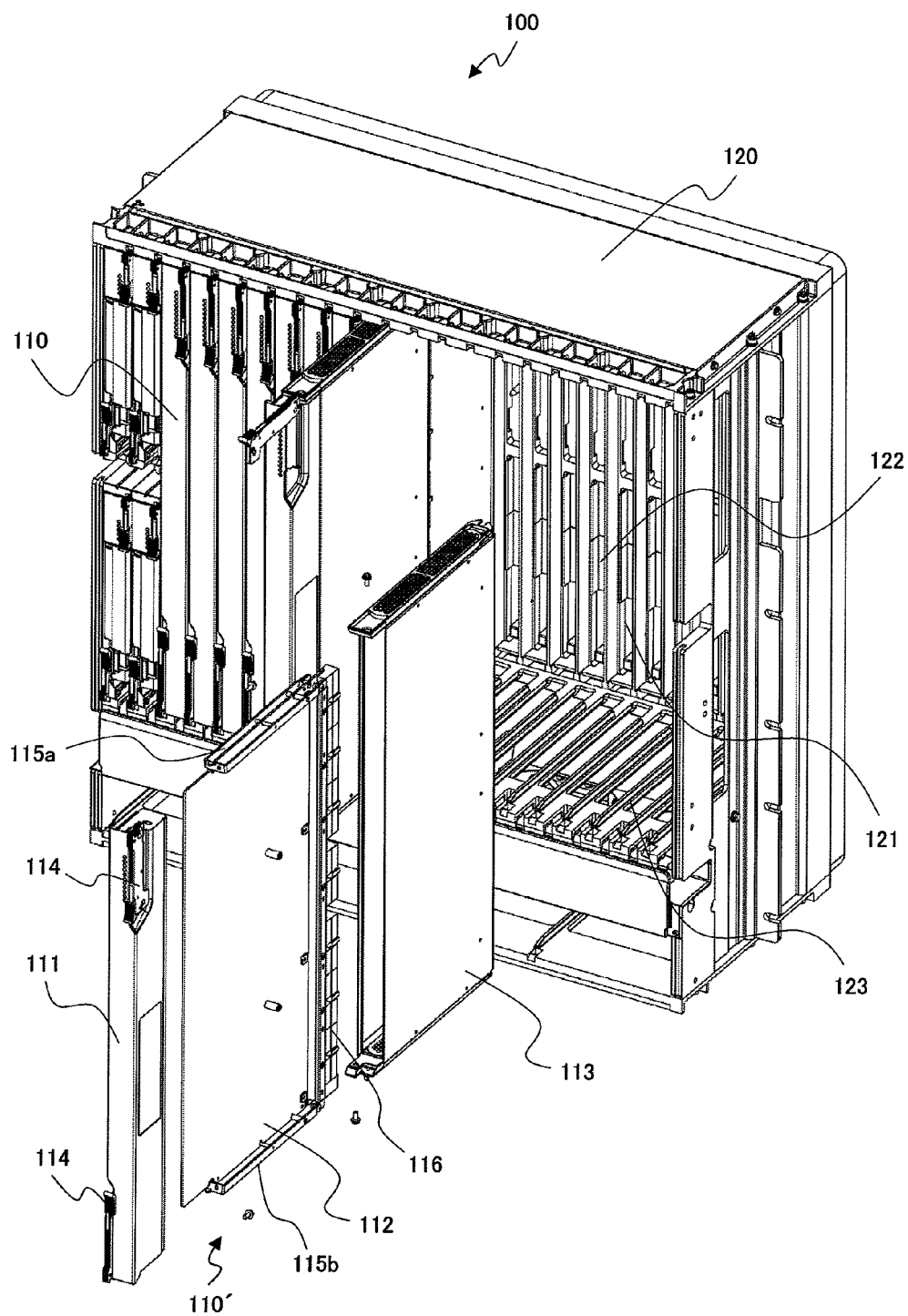
FIG. 8 is a perspective view of a conventional communication apparatus.

As shown in FIG. 1, a communication apparatus 1 comprises a sub-rack 10 and a plurality of plug-in units 20a to 20d and 110 installed in the sub-rack 10 by insertion. The plug-in unit 110 is the same as the conventional plug-in unit 110 described above with reference to FIG. 8 and FIG. 9, and thus a detailed description thereof is not provided.

The sub-rack 10 adopts a book-shelf type form, and the plug-in units 20a to 20d are arranged in parallel in two rows (upper and lower) from the left side (left side in FIG. 1) facing the front side of the sub-rack 10. More specifically, the plug-in units 20a and 20b are installed by insertion in the upper row of the sub-rack 10 and the plug-in units 20c and 20b are installed by insertion in the lower row.

Then, a plurality (here seven) of plug-in units 110 are installed by insertion in parallel in a row inside the sub-rack 10.

The sub-rack 10 comprises a back plane 11 on a back surface and the back plane 11 has a plurality of back plane connectors (connectors) 12.

Also, guide rails 13 for inserting the plug-in units 20a to 20d (hereinafter simply denoted by numeral 20 when the plug-in units 20a, 20b, 20c, and 20d are not distinguished) and the plug-in units 110 are provided on the lower surface and upper surface inside the sub-rack 10.

A plurality of back plane connectors 12 and a plurality of guide rails 13 are provided in the sub-rack 10 corresponding to a plurality of plug-in units 20 and a plurality of plug-in units 110.

Meanwhile, the plug-in units 20 in FIG. 1 show a state in which external optical fibers 90 are connected to interface parts 60a to 60d (Not shown in FIG. 1. See, for example, FIG. 2) described later.

Figure 2:
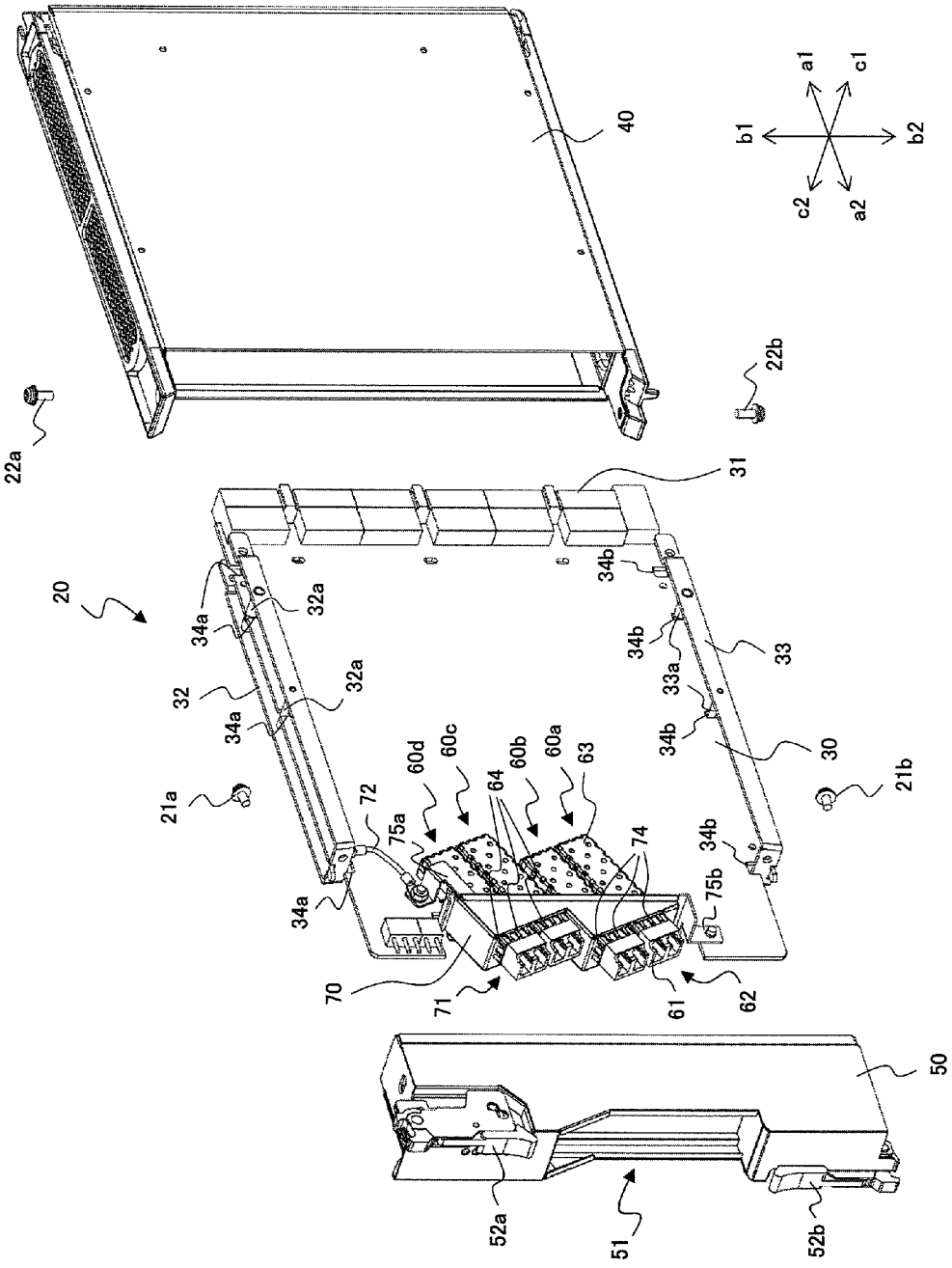
FIG. 2 is an exploded perspective view illustrating a structure of a plug-in unit of the communication apparatus as an embodiment of the present invention.
Figure 3:
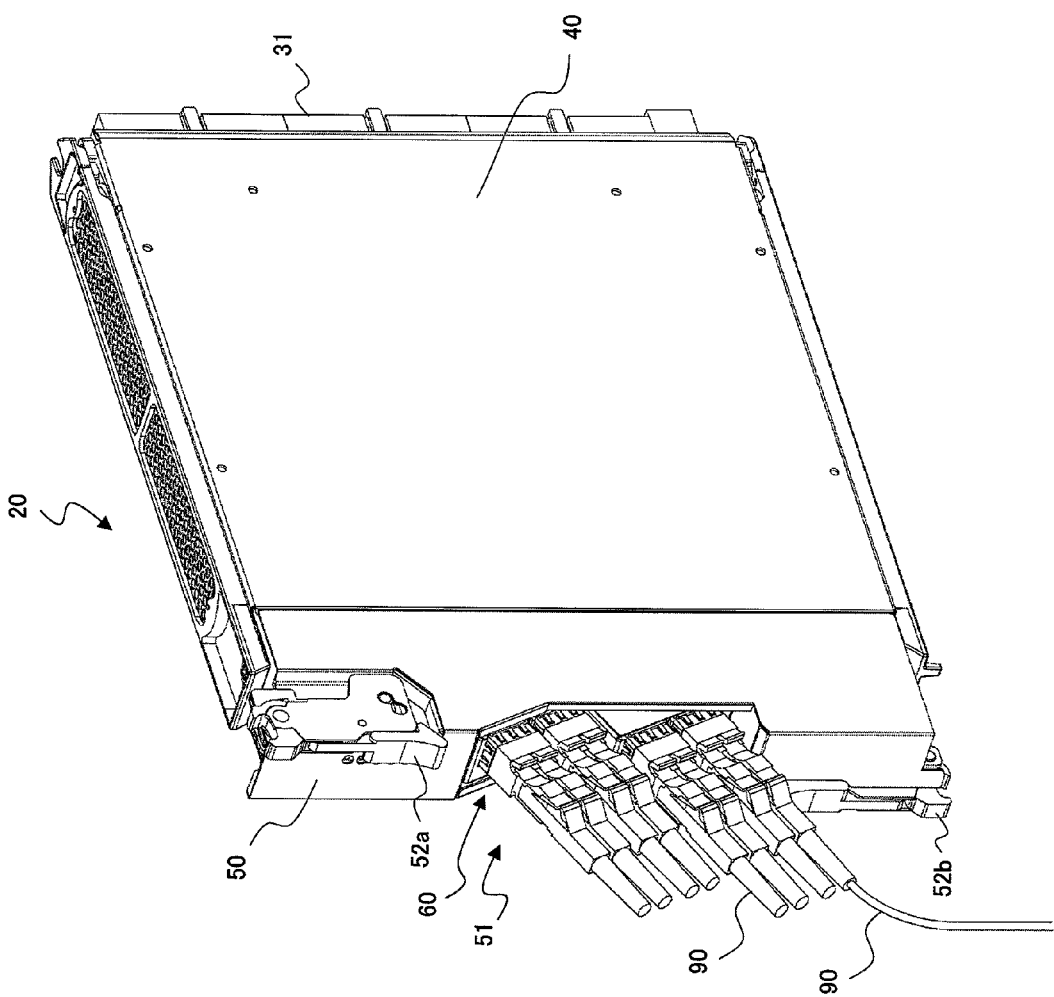
FIG. 3 is a perspective view showing the plug-in unit of the communication apparatus as an embodiment of the present invention.

Next, the plug-in unit 20 will be described with reference to FIG. 2 and FIG. 3. FIG. 2 is a diagram showing the plug-in unit 20 before assembled and the plug-in unit 20 shown in FIG. 3 shows a state in which the external optical fibers 90 are connected to the interface parts 60a to 60d (denoted simply by numeral 60 in FIG. 3) described later.

As shown in FIG. 2, the plug-in unit 20 comprises a printed wiring board (printed board) 30, a shield cover (first shield cover member) 40, and a front panel (front cover member) 50.

Plug-in unit connectors 31 provided at the rear end of the printed board 30 protrude from a shield cover 40 in a rear end part (rear part) of the plug-in unit 20, and the plug-in unit connectors 31 are connected to the back plane connectors 12 when the plug-in unit 20 is installed in the sub-rack 10 by insertion. As a result, the plug-in unit 20 and the sub-rack 10 are electrically connected.

On the printed board 30 of the plug-in unit 20, the interface parts 60a to 60d as interfaces with the outside are mounted together with a plurality of electronic components (not shown). Since each of these interface parts 60a to 60d is the same, numeral 60 is simply used for description when these interface parts 60a to 60d are not distinguished.

The shield cover 40 covers the upper and lower surfaces and both sides of the printed board 30 and has a cylindrical or box shape with open front and rear end faces.

The front panel 50 covers a front surface of the printed board 30 and has an opening (second opening) 51 that exposes to the outside a connection (connector part) 61 with the outside of the interface part 60 mounted on the printed board 30.

The shield cover 40 and front panel 50 are made of conductive material such as aluminum and stainless.

Here, an assembly method of the plug-in unit 20 will be described. First, the front panel 50 and arm members 32 and 33 arranged to extend along the upper and lower surfaces of the printed board 30 are connected by screws 21a and 21b respectively. The arm members 32 and 33 are also made of conductive material.

The interface part 60 protrudes from a front end part of the printed board 30. Since the opening 51 is provided at the position corresponding to the interface part 60 of the front panel 50, the printed board 30 and the front panel 50 can be connected while exposing the connection 61 of the interface part 60 to the outside.

Next, the printed board 30 is installed in the shield cover 40 by insertion via the arm members 32 and 33, and further the front panel 50 and the shield cover 40 are connected by screws 22a and 22b to assemble the plug-in unit 20.

Meanwhile, the plug-in unit 20 is installed in the sub-rack 10 by insertion using card levers 52a and 52b of the front panel 50.

Figure 10A:
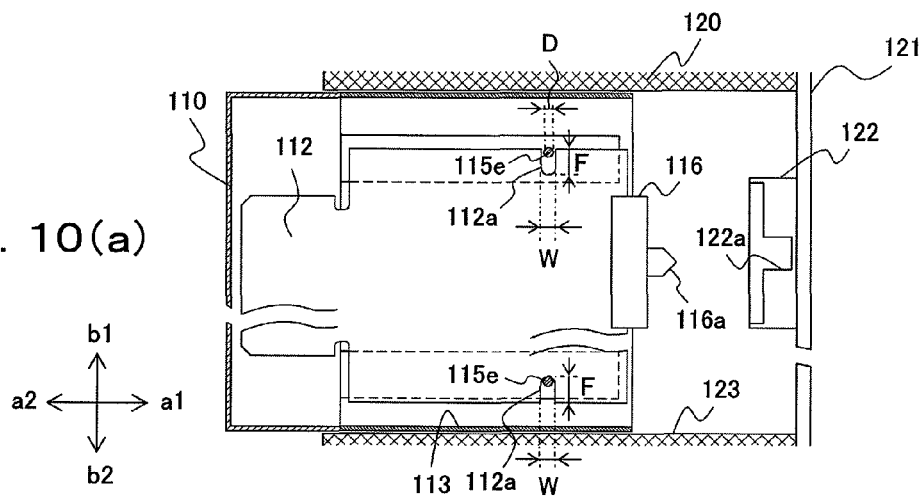
FIGS. 10(a) to (c) are diagrams illustrating a sequence for inserting the plug-in unit of the conventional communication apparatus shown in FIG. 8 into a sub-rack device.
Figure 10B:
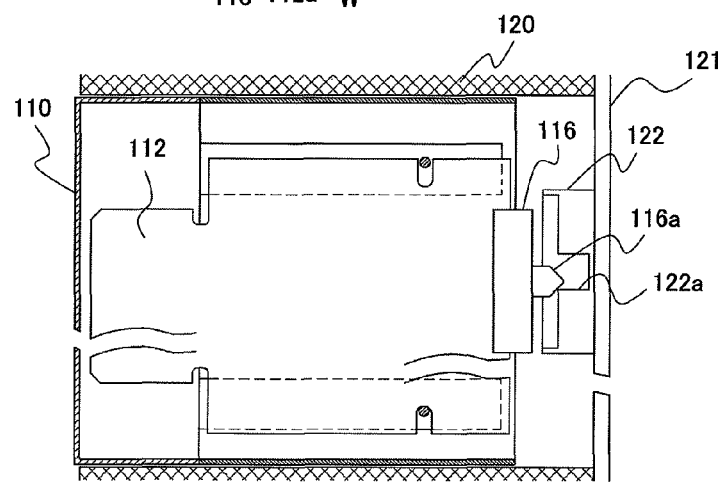
Figure 10C:
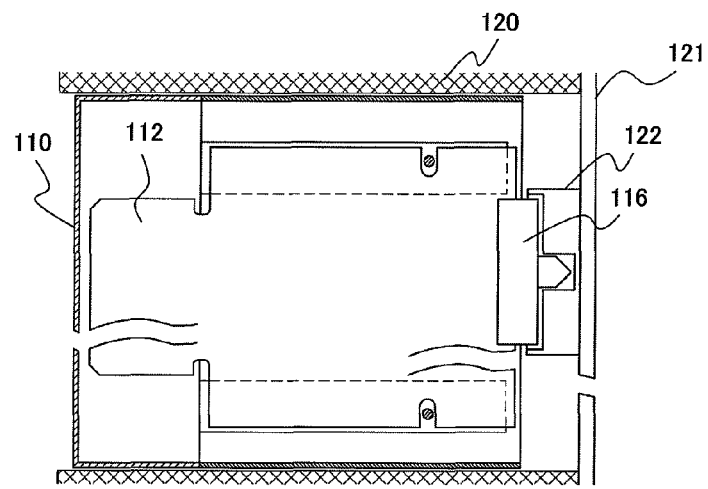
Figure 12A:
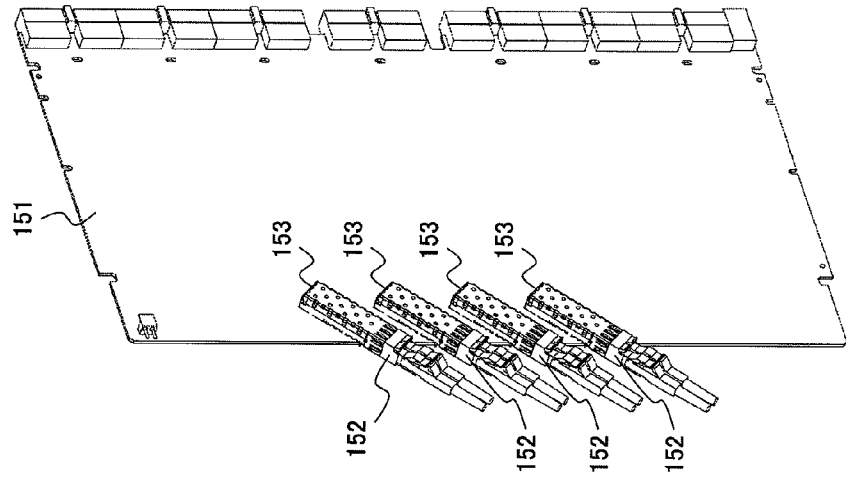
FIGS. 12(a) and (b) are diagrams showing a conventional plug-in unit having the interface part to the outside; (a) is a perspective view thereof and (b) is a perspective view showing a printed board thereof.
Figure 12B:
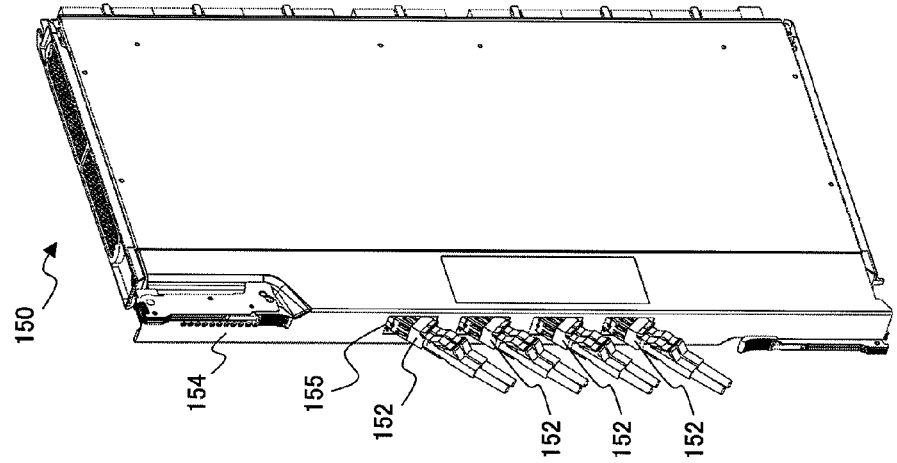

Also in the plug-in unit 20, with a configuration similar to that of the conventional plug-in unit 110 described above with reference to FIGS. 10(a) to (c) (that is, arm members, cutouts of the printed board and the like), the printed board 30 is housed freely movably in upper-lower direction (vertical direction; b1-b2 direction) in the shield cover 40 and front panel 50.

That is, as shown in FIG. 2, cutouts 34a and 34b are provided at positions corresponding to pins 32a and 33a of the arm members 32 and 33 of the printed board 30 and lengths of these cutouts 34a and 34b are set larger than diameters of the pins 32a and 33a so that the printed board 30 is freely movable in the vertical direction (b1-b2 direction).

An earth plate (second shield cover member) 70 that covers a portion of the interface part 60 mounted on the printed board 30 protruding from the front end part of the printed board 30 and has an opening (first opening) 71 exposing to the outside the connection 61 with the outside provided at the front end of the interface part 60, the opening 71 being in contact with the circumferential surface of the interface part 60, is fastened to the printed board 30. The earth plate 70 is also made of conductive material such as aluminum and stainless.

A ground lead 72 whose edge is connected to the arm member 32 is connected to the earth plate 70. Here, the plug-in unit 20 is grounded by the shield cover 40 being in contact with the grounded sub-rack 10, and as described above, the arm member 32, front panel 50, shield cover 40, and sub-rack 10 are all made of conductive material and therefore the earth plate 70 is grounded by the ground lead 72 via the arm member 32, front panel 50, shield cover 40, and sub-rack 10.

The interface part 60 functions as an interface with the outside and comprises a case (cage) 63 insertably/removably housing a module [for example, SFP (Small form Factor Pluggable)] 62 having the connection 61 with the outside and an electric connector (not shown).

Then, the case 63 and electric connector are fastened to the printed board 30 and the module 62 is installed in the case 63 by insertion to electrically connect the module 62 and printed board 30 via the electric connector.

Shield fingers (contact part) 64 in contact with the earth plate 70 in the opening 71 of the earth plate 70 (here, an internal surface of the opening 71 of the earth plate 70) are provided at positions (front end part of the case 63) facing the opening 71 of the earth plate 70 of the case 63. The shield fingers 64 are formed by cutting out a portion of the case 63.

The shield finger 64 is also made of conductive material and a gap between the opening 71 of the earth plate 70 and the outer circumferential surface of the interface part 60 (here, the case 63) is thereby electromagnetically shielded by the shield fingers 64, and as a result, electromagnetic waves generated inside the plug-in unit 20 can be inhibited from exiting through the gap between the opening 71 of the earth plate 70 and the outer circumferential surface of the interface part 60 (here, the case 63).

Further, for example, even when static electricity is discharged to the connection 61 of the interface part 60 from outside, the shield finger 64 electrically connects the opening 71 of the earth plate 70 and the outer circumferential surface of the interface part 60 (here, the case 63), and further the earth plate 70 is grounded by the ground lead 72. Therefore, the static electricity flows to an earth side without being electrically connected to the printed board 30, reliably reducing an influence of the static electricity.

In the communication apparatus 1, as shown in FIG. 2, the case 63 is installed in the opening 71 of the earth plate 70 from inside the printed board 30 to pass through the opening 71 while the shield finger 64 of the case 63 is in contact with the inside surface of the opening 71 of the earth plate 70, so that the case 63 is fastened to the printed board 30 while being sandwiched by the earth plates 70 after mounting arm members 75a and 75b of the earth plate 70 are fastened to the printed board 30 using, for example, screws.

Here, the shield finger 64 comprises a spring mechanism having thrust to the earth plate 70 and unsteadiness and shifts of the case 63 in the opening 71 of the earth plate 70 can thereby be inhibited so that the earth plate 70 can firmly sandwich the case 63.

Figure 4:
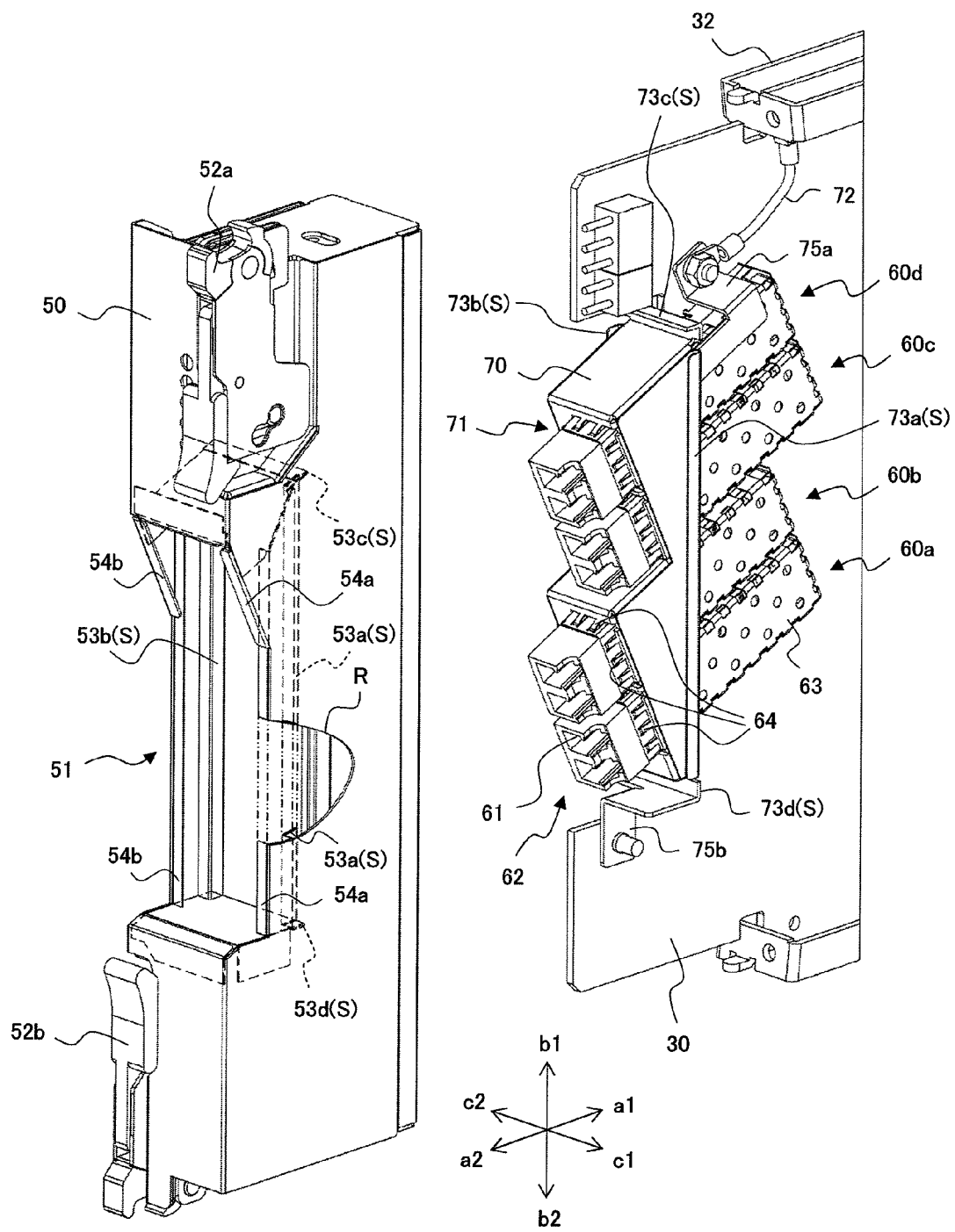
FIG. 4 is an exploded perspective view showing a shield mechanism of the plug-in unit of the communication apparatus as an embodiment of the present invention by cutting away a portion thereof for illustration.

Next, the configuration of the front panel 50 and earth plate 70 will further be described in detail with reference to FIG. 4. A cutout part R in FIG. 4 is intended to show an inner side of the front panel 50 and is not provided in the actual front panel 50. Also, as denoted by chain double-dashed lines in the cutout part R, pieces 53a and 54a described later essentially extend into the cutout part R.

As shown in FIG. 4, standing wall parts 73a to 73d are provided on the circumferential surface of the earth plate 70. These standing wall parts 73a to 73d are also made of conductive material such as aluminum and stainless.

The standing wall parts 73a and 73b extend in the upper-lower direction (b1-b2 direction) along the sides of the earth plate 70 to form grooves L (See FIGS. 6(a) and (b) described later) for the front panel 50.

The standing wall part 73c extends in left-right direction (depth direction: c1-c2 direction) along the upper surface of the earth plate 70 to form a groove M (See FIGS. 7(a) and (b) described later) for the front panel 50, and further the standing wall part 73d extends in the left-right direction (depth direction: c1-c2 direction) along the lower surface of the earth plate 70 to form a groove N (See FIGS. 7(a) and (c) described later) for the front panel 50.

Further, as shown in FIG. 4, the front panel 50 is provided with pieces 53a to 53d extending along the edge of the opening 51 inside the front panel 50. These pieces 53a to 53d are also made of conductive material such as aluminum and stainless.

These pieces 53a to 53d are formed to extend toward (here, in the a1-a2 direction) the corresponding grooves L, M, and N formed by the standing wall parts 73a to 73d respectively.

More specifically, the piece 53a extending in the upper-lower direction (b1-b2 direction) along a side part of the opening 51 on the inside surface of the opening 51 of the front panel 50 is formed so that the edge thereof enters the groove L formed by the standing wall part 73a, and similarly, the piece 53b extending in the upper-lower direction (b1-b2 direction) along the side part of the opening 51 on the inside surface of the opening 51 is formed so that the edge thereof enters the groove L formed by the standing wall part 73b.

Also, the piece 53c extending in the horizontal left-right (depth direction: c1-c2 direction) along an upper side of the opening 51 on the inside surface of the opening 51 of the front panel 50 is formed so that the edge thereof enters the groove M formed by the standing wall part 73c, and the piece 53d extending in the left-right direction (depth direction: c1-c2 direction) along a lower side of the opening 51 on the inside surface of the opening 51 is formed so that the edge thereof enters the groove N formed by the standing wall part 73d.

The standing wall parts 73a to 73d provided on the circumferential surface of the earth plate 70 and the pieces 53a to 53d provided on the inside surface of the front panel 50 are interposed between the earth plate 70 and the opening 51 of the front panel 50 to function as a shield mechanism S covering a gap between the opening 51 of the front panel 50 and the outer circumferential surface of the earth plate 70.

Therefore, the standing wall parts 73a to 73d and the pieces 53a to 53d functioning as the shield mechanism S are interposed between the earth plate 70 and the opening 51 of the front panel 50 to electromagnetically shield the gap between the opening 51 of the front panel 50 and the outer circumferential surface of the earth plate 70 and, as a result, it becomes possible to reliably inhibit electromagnetic waves generated inside the plug-in unit 20 from exiting the plug-in unit 20 and also to inhibit external electromagnetic waves from entering the printed board 30.

Further, for example, even when static electricity is discharged to the connection 61 of the interface part 60 from outside, the static electricity electrically connected to the standing wall parts 73a to 73d and the pieces 53a to 53d flows to the earth side of the earth plate 70 or front panel 50 without being electrically connected to inside the printed board 30, reliably reducing an influence of the static electricity.

Pieces 54a and 54b extending toward an opening center along the upper-lower direction (b1-b2 direction) of the opening 51 are provided at edges on both sides of the opening 51 of the front panel 50. These pieces 54a and 54b are also made of conductive material. The gap between the opening 51 of the front panel 50 and the circumferential surface of the interface part 60 exposed from the opening 51 can be covered by the pieces 54a and 54b by the length thereof so that leaking-out of electromagnetic waves generated inside the plug-in unit 20 to the outside and an entry of external electromagnetic waves into the plug-in unit 20 from the outside can be inhibited to some extent.

Here, FIG. 5 is a diagram showing the plug-in unit 20; (a) is a top view thereof, (b) is a side view thereof, and (c) is a front view thereof. FIGS. 6(a) and (b) are A-A' sectional views of FIG. 5(b) and FIGS. 7(a) to (c) are B-B' sectional views of FIG. 5(c).

As shown in FIG. 6(a), the standing wall parts 73a and 73b are provided so as to form the groove L for the front panel 50, and each of the standing wall parts 73a and 73b is bent to form a U-shaped cross section.

The piece 53a is formed to enter the groove L so that the edge of the piece 53a and that of the standing wall part 73a overlap, and the piece 53b is formed to enter the groove L so that the edge of the piece 53b and that of the standing wall part 73b overlap.

Here, a circle X' in FIG. 6(b) is an enlarged view of a circle X portion of FIG. 6(a). As shown in FIG. 6(b), inside dimension e of the grooves L formed by the standing wall parts 73a and 73b are configured to be slightly larger than outside dimension f of the edges of the pieces 53a and 53b. The printed board 30 is thereby made not freely movable in the depth direction (c1-c2 direction) of the plug-in unit 20, facing the front panel 50.

Also, as shown in FIG. 7(a), the standing wall parts 73c and 73d are provided to form the groove M and the groove N respectively for the front panel, and each of the standing wall parts 73c and 73d is bent to form a U-shaped cross section.

Here, a circle Y' in FIG. 7(b) is an enlarged view of a circle Y portion of FIG. 7(a) and a circle Z' in FIG. 7(c) is an enlarged view of a circle Z portion of FIG. 7(a)

As shown in FIG. 7(b), inside dimensions g of the groove M formed by the standing wall part 73c are configured to be sufficiently larger than outside dimensions h of the edge of the piece 53c.

Further, as shown in FIG. 7(c), inside dimensions j of the groove N formed by the standing wall part 73d are configured to be sufficiently larger than outside dimensions k of the edge of the piece 53d.

The printed board 30 is thereby made freely movable in the upper-lower direction (b1-b2 direction) of the plug-in unit 20, facing the front panel 50.

In other words, with inside dimensions of the grooves M and N formed by the standing wall parts 73c and 73d that are formed sufficiently larger than the outside dimensions h and k of the edges of the pieces 53c and 53d so that the printed board 30 is housed in the front panel 50 and shield cover 40 freely movably in the upper-lower direction, and further, as described above, lengths of the cutouts 34a and 34b of the printed board 30 formed larger than diameters of the pins 32a and 33a of the arm members 32 and 33 respectively, the back plane connector 12 provided on the back plane 11 of the sub-rack 10 and the plug-in unit connector 31 provided at the rear end of the printed board 30 can reliably be connected without being influenced by variations (tolerance accumulation) of dimensions of components of the plug-in unit 20 and sub-rack device 10.

According to the communication apparatus 1 as an embodiment of the present invention, as described above, even when the interface part 60 is mounted on the printed board 30 so that the module 62 becomes insertable/removable into/from the plug-in unit 20, it becomes possible not only to reliably realize electromagnetic shielding of the plug-in unit 20 from the printed board 30, but also to realize reduction of an influence caused by static electricity because a portion protruding from the front end surface of the printed board 30 in the interface part 60 is covered by the earth plate 70 and a gap between the opening 51 of the front panel 50 and the outer circumferential surface of the earth plate 70 is covered by the pieces 53a to 53d and the standing wall parts 73a to 73d functioning as the shield mechanism S.

Further, since the shield finger 64 provided in the case 63 as the outer circumferential surface of the interface part 60 is configured to be in contact with the earth plate 70, leaking-out and entries of electromagnetic waves through the gap between the opening 71 of the earth plate 70 and the outer circumferential surface of the interface part 60 (case 63) can be inhibited, realizing electromagnetic shielding of the plug-in unit 20 more reliably.

Also, since the pieces 53a to 53d are configured to enter the corresponding grooves L, M, and N formed by the standing wall parts 73a and 73d respectively so that, in this case, the edges of the pieces 53a to 53d and those of the standing wall parts 73a to 73d overlap, an electromagnetic gap between the opening 51 of the front panel 50 and the outer circumferential surface of the earth plate 70 can be eliminated, resulting in more reliable realization of electromagnetic shielding of the plug-in unit 20.

Since the earth plate 70 is grounded, an influence of static electricity of the plug-in unit 20 on the printed board 30 can more reliably be reduced.

[2] Others

Meanwhile, the present invention is not limited to the above embodiment and can be carried out in various modifications without departing from the spirit and scope of the present invention.

In the above embodiment, for example, the printed board 30 is configured to be housed freely movably in the shield cover 40 and front panel 50, but the present invention is not limited to this embodiment and the printed board 30 may be configured to be fixed inside the shield cover 40 and front panel 50. In this case, the inside dimensions g and j of the grooves M and N formed by the standing wall parts 73c and 73d extending along the upper and lower surfaces of the earth plate 70 only need to be configured slightly larger than the outside dimensions h and k of the edges of the corresponding pieces 53a and 53b.

Also, the earth plate 70 is configured to be grounded by the ground lead 72 in the above embodiment, but the present invention is not limited to this embodiment and the earth plate 70 only needs to be grounded by any method.

Further, the pieces 53a to 53d and the standing wall parts 73a to 73d are configured to function as the shield mechanism S in the above embodiment, but the present invention is not limited to this embodiment, and anything that covers a gap between the opening 51 of the front panel 50 and the outer circumferential surface of the earth plate 70 to electromagnetically shield the gap may be used as the shield mechanism S.

Therefore, shapes of the pieces 53a to 53d and the standing wall parts 73a to 73d are not limited to those in the above embodiment and, for example, the pieces 53a to 53d may be configured to form grooves with respect to the standing wall parts 73a to 73d so that the grooves of the pieces 53a to 53d and those of the standing wall parts 73a to 73d overlap to be fitted. Or, while neither the pieces 53a to 53d nor the standing wall parts 73a to 73d are configured to form grooves, edges of the pieces 53a to 53d and those of the standing wall parts 73a to 73d may be bent to a right angle or an acute angle to cover the gap between the opening 51 of the front panel 50 and the outer circumferential surface of the earth plate 70 so that the edges of the pieces 53a to 53d and those of the standing wall parts 73a to 73d overlap. In these cases, similar working effects as those of the above embodiment can be obtained.

Also, the above embodiment was described with reference to an example in which the shield finger 64 is formed by cutting out the case 63, but the present invention is not limited to this embodiment, and the shield finger 64 may be configured by a member different from that of the case 63 and mounted in the case 63 or at the end face of the opening 71 of the earth plate 70. The shield finger 64 only needs to be able to realize electromagnetic shielding at least in a gap between the opening 71 of the earth plate 70 and the outer circumferential surface of the interface part 60 (here, the case 63).

What is claimed is:

1. A plug-in unit, comprising:
   a printed board on which an interface part is mounted as an interface with an outside;
   a first shield cover member covering each of upper and lower surfaces and both sides of said printed board;
   a second shield cover member covering a portion protruding from a front end surface of said printed board in the interface part and having a first opening to expose a connection with the outside provided at a front end of the interface part to the outside, said first opening being in contact with a circumferential surface of the interface part;
   a front cover member covering a front of said printed board and having a second opening to expose the connection of the interface part to the outside; and
   a shield mechanism interposed between said second shield cover member and said front cover member to cover a gap between said second opening of said front cover member and an outer circumferential surface of said second shield cover member.

2. The plug-in unit according to claim 1, wherein said shield mechanism comprises:
   a standing wall part forming grooves on the circumferential surface of said second shield cover member, facing said front cover member; and
   pieces extending along the edge of said second opening on an inside surface of said front cover member, and extending in said grooves formed by said standing wall part.

3. The plug-in unit according to claim 2, wherein said printed board is housed in said first shield cover member and said front cover member freely movably in upper-lower direction of said printed board,
   said second shield cover member is fastened to said printed board, and
   inside dimensions of said grooves formed on the upper and lower surfaces of said second shield cover member from among said grooves formed by said standing wall part are formed larger than outside dimensions of said pieces of said front cover member extending in said grooves.

4. The plug-in unit according to claim 1, wherein said second shield cover member is grounded.

5. The plug-in unit according to claim 4, wherein said second shield cover member is grounded via said front cover member and said first shield cover member.

6. A communication apparatus, comprising:
   a sub-rack having a back plane with a connector; and
   a plug-in unit mounted to said sub-rack by electric connection via said connector of said back plane, wherein said plug-in unit comprises:
   a printed board on which an interface part is mounted as an interface with an outside;
   a first shield cover member covering each of upper and lower surfaces and both sides of said printed board;
   a second shield cover member covering a portion protruding from a front end surface of said printed board in the interface part and having a first opening to expose a connection with the outside provided at a front end of the interface part to the outside, said first opening being in contact with a circumferential surface of the interface part;
   a front cover member covering a front of said printed board and having a second opening to expose the connection of the interface part to the outside; and
   a shield mechanism interposed between said second shield cover member and said front cover member to cover a gap between said second opening of said front cover member and an outer circumferential surface of said second shield cover member.

7. The communication apparatus according to claim 6, wherein said shield mechanism comprises:

a standing wall part forming grooves on the circumferential surface of said second shield cover member, facing said front cover member; and pieces extending along the edge of said second opening on an inside surface of said front cover member, and extending in said grooves formed by said standing wall part.

8. The communication apparatus according to claim 7, wherein said printed board is housed in said first shield cover member and said front cover member freely movably in upper-lower direction of said printed board, said second shield cover member is fastened to said printed board, and inside dimensions of said grooves formed on the upper and lower surfaces of said second shield cover member from among said grooves formed by said standing wall part are formed larger than outside dimensions of said pieces of said front cover member extending in said grooves.

9. The communication apparatus according to claim 6, wherein said second shield cover member is grounded.

10. The communication apparatus according to claim 9, wherein said second shield cover member is grounded via said front cover member and said first shield cover member.

* * * * *